US006806008B2

(12) United States Patent
Schedel et al.

(10) Patent No.: US 6,806,008 B2
(45) Date of Patent: Oct. 19, 2004

(54) METHOD FOR ADJUSTING A TEMPERATURE IN A RESIST PROCESS

(75) Inventors: Thorsten Schedel, Dresden (DE); Torsten Seidel, Dresden (DE)

(73) Assignee: Infineon Technologies SC300 GmbH & Co. KG, Dresden (DE)

( * ) Notice: Subject to any disclaimer, the term of this patent is extended or adjusted under 35 U.S.C. 154(b) by 122 days.

(21) Appl. No.: 10/190,097

(22) Filed: Jul. 3, 2002

(65) Prior Publication Data

US 2003/0008242 A1 Jan. 9, 2003

(30) Foreign Application Priority Data

Jul. 3, 2001 (EP) ............................................ 01116132

(51) Int. Cl.⁷ ................................................ G03F 7/26
(52) U.S. Cl. .......................... 430/30; 430/311; 430/330; 356/496; 356/636
(58) Field of Search .......................... 430/30, 311, 313, 430/330; 356/302, 326, 451, 496, 625, 635, 636

(56) References Cited

U.S. PATENT DOCUMENTS

| 4,409,319 A | 10/1983 | Colacino et al. ............. 430/296 |
| 6,034,771 A | 3/2000 | Rangarajan et al. ........ 356/345 |
| 2003/0129509 A1 * | 7/2003 | Yamaguchi ................... 430/30 |

OTHER PUBLICATIONS

Sekiguchi, A. et al.; "Measuring System for Diffusion Length of Photoactive Compound in Post–Exposure Bake Process", Scripta Technica Inc., Part 2, vol. 79, No. 9, 1996, pp. 70–77.

Sohn, Y.–S. et al.: "Effect of Temperature Variation During Post Exposure Bake on 193 nm Chemically Amplified Resist Simulation", Microprosesses and Nanotechnology, Jul. 11, 2000, pp. 100–101.

Author not listed "Method for Controlling Photoresist Sidewall Angle", IBM Corp., Oct. 1, 1987, p. 37.

Author not listed: "Selective Modification of Resist Sidewall Profiles With a Post Devlopment Bake", IBM Corporation, vol. 32, No. 3A, Aug. 1989, pp. 141–145.

* cited by examiner

Primary Examiner—Kathleen Duda
(74) Attorney, Agent, or Firm—Laurence A. Greenberg; Werner H. Stemer; Ralph E. Locher

(57) ABSTRACT

A test reticle having a pad and antenna structures with varying critical dimensions is provided to measure sidewall angles developing in the resist sidewalls of clear lines. These sidewall angles originate from resist flow due to the occurrence of excessively high temperatures in a resist process on a lithographic track after the exposure of a semiconductor wafer. A scanning electron microscope is used to perform the measurement. A sequence of temperatures is applied in each postbake step to process a wafer, and the sidewall angle is determined afterwards from e.g. a critical dimension measurement with a known resist thickness. An error signal is issued, if a threshold value of a sidewall angle is exceeded. The temperature of the resist process, e.g. the postbake, is then adjusted to a temperature below the temperature causing the warning signal.

5 Claims, 4 Drawing Sheets

METHOD FOR ADJUSTING A TEMPERATURE IN A RESIST PROCESS

BACKGROUND OF THE INVENTION

Field of the Invention

The present invention relates to a method for adjusting a temperature in a resist process after the exposure of at least one semiconductor wafer.

With continuously decreasing feature sizes in semiconductor wafer manufacturing, the influence with respect to accuracy of detail processes other than exposure on a lithographic track are growing more and more important.

The sequence of detail process steps on a lithographic track typically starts with depositing an adhesive substance, e.g. HMDS (hexamethyl disilazane), followed by coating the semiconductor wafer with a resist having a thickness of 0.3–5 μm, depending on the technology used. After stripping the resist off of the backside and the edges of the wafer, a prebake step with a temperature of, e.g., 80–100° C. is applied to the wafer for improving the adhesion and for hardening the resist.

After prebake—also called softbake—the exposure of the photo sensitive resist with a pattern projected from a mask or reticle in a wafer stepper or scanner is performed.

A resist process is then started by applying a post-exposure bake with typical temperatures of 100–110° C., which is intended to generate a small flow of resist for smoothing out periodic intensity modulation due to interference effects. Those are produced by a possible back-reflection from a layer that underlies the resist layer and results in generating stationary waves.

In a development step, chemically altered resist material—due to a photo-chemical reaction—is removed in case of a positive photo resist, thereby leaving behind a pattern structure in the resist layer.

In order to increase the resistance of the photo resist layer against the following etching step depending on its aggressivity, a temperature of about 120° C. is applied to the resist for a third time known as the post-bake step. This step may be replaced by UV-hardening.

When using a chemically amplified resist, the temperatures applied may considerably deviate from the values given above. Chemically amplified resists are often used for an exposure wave length of 248 nm and below.

The final processes are etching, thereby transferring the resist pattern into the desired layer, or implantation followed by stripping off the resist. As is clearly visible from the process steps described, the temperature treatment is a critical issue on the lithographic track. Typically, there are small temperature windows with a lower temperature limit given by, e.g. a glassy point for which the desired function of the resist becomes active, and an upper limit at which plastic resist flow sets in. Further requirements are the reduction of water absorption and adhesion improvement.

Unfortunately, particularly the upper limit of the temperature represents a smooth limit and the disadvantageous effect of resist flow may already become apparent at moderate temperatures, e.g. during post-exposure bake, if particularly small feature sizes will be patterned into the resist.

Investigations related to quantifying this effect on line shapes can be found, e.g., in "Selective modification of resist sidewall profiles with a post development bake", IBM Technical Disclosure Bulletin, Vol. 32, 1989, pages 141–145, XP 000049332, wherein line shape profiles are measured as a function of post exposure bake temperature. In addition, reference can be made to Young-Soo Sohn et al., "Effect of temperature variation during post exposure bake on 193 nm chemically amplified resist simulation", Digest of papers Microprocesses and Nanotechnology, 2000, Society of Applied Physics, Japan, XP 001051557, which describes the performance of critical dimension measurements of lines structured in a resist, which have each experienced different temperatures.

Moreover, processes are adapted to fixed values of the temperature setup and in order to maintain uniformity from wafer to wafer, temperature deviations have to be particularly small, e.g. below 1° C.

In order to improve the temperature treatment of the different baking steps, a system for uniform heating of a photo resist is provided in U.S. Pat. No. 6,034,771. In this teaching, radiation is applied to the photo resist, and an actual temperature of the resist can be determined from a measurement of the reflected light. Given this temperature information, a deviation from a desired value can be calculated and a temperature adjustment can be performed using heating lamps that irradiate heating light onto the resist. The temperature is thereby determined indirectly from a relationship between, e.g. resist thickness and temperature, or resist absorption and temperature, which has to be known a priori.

Unfortunately, it is not clear whether such a relationship remains constant during the different processing steps, thereby providing sufficient accuracy to adjust the temperature.

SUMMARY OF THE INVENTION

It is accordingly an object of the invention to provide a method for adjusting the temperature in a resist process which overcomes the above-mentioned disadvantages of the prior art methods of this general type.

It is a primary objective of the present invention to improve the temperatures during different baking steps in a resist process in order to adhere to wafer specification tolerances, and to thereby improve the wafer yield on the lithographic track.

With the foregoing and other objects in view there is provided, in accordance with the invention, a method for adjusting a temperature in a resist process. The method includes: providing at least a first semiconductor wafer coated with a resist; and providing a reticle test pattern including at least one pad structure having a first critical dimension and at least one antenna structure having a second critical dimension. The antenna structure is connected to the pad structure and the first critical dimension is at least 1.5 times the second critical dimension. The method also includes: exposing the first semiconductor wafer by projecting the pattern onto the resist to configure the pattern into the resist; performing a first resist process on the first semiconductor wafer while applying a first temperature; and determining a first sidewall angle of the pattern in the resist on the first semiconductor wafer by:

a) obtaining a first measured value by measuring the second critical dimension of the antenna structure, b) obtaining a second measured value by measuring the first critical dimension of the pad structure, and c) comparing the first measured value and the second measured value.

The method then includes: issuing a first signal, if the first sidewall angle exceeds a pre-defined threshold value; and adjusting the temperature of the resist process in response to the first signal.

In accordance with an added feature of the invention, the method includes: providing at least a second semiconductor wafer coated with a resist; exposing the second semiconductor wafer to configure the pattern in the resist on the second semiconductor wafer; performing a second resist process on the second semiconductor wafer with a second temperature that is different from the first temperature; measuring a second sidewall angle of the pattern in the resist on the second semiconductor wafer; comparing the first sidewall angle and the second sidewall angle; issuing a second signal, if the difference between the first sidewall angle and the second sidewall angle exceeds a pre-defined difference threshold value; and adjusting the temperature of the resist process in response to the second signal.

In accordance with an additional feature of the invention, the the pattern in the resist on the first semiconductor wafer is structured within a scribeline area of the first semiconductor wafer; and the pattern in the resist on the second semiconductor wafer is structured within a scribeline area of the second semiconductor wafer.

In accordance with another feature of the invention, the step of determining the first sidewall angle is performed by using a scanning electron microscope, an interferometer, and/or a scatterometer.

In other words, objective of the present invention is solved by a method for adjusting a temperature in a resist process after an exposure of at least one semiconductor wafer. The method includes steps of: providing at least a first semiconductor wafer coated with a resist, exposing the first semiconductor wafer with a projected reticle test pattern, performing a first resist process on the first semiconductor wafer, applying a first temperature, measuring a first sidewall angle of the pattern in the resist on the first semiconductor wafer, issuing a signal if the first resist sidewall angle exceeds a pre-defined threshold value, and adjusting the temperature of the resist process in response to the signal.

The sidewall angle measurement also denotes a critical dimension measurement of the resist sidewall. The critical dimension of a structure used here is the metric distance between two points, e.g. edges of a structure, in the plane of the wafer—or reticle. With a known vertical resist thickness, the sidewall angle has a tight correlation with the critical dimension of the sidewall.

According to the present invention, there is underlying the perception that the impact of resist flow also depends on the extent of the resist pattern. Thus, advantage is taken of measuring the sidewall angle at resist edges at structures having different feature sizes. By measuring the sidewall angle, the direct impact of temperature deviations is measured by a decrease in the corresponding critical dimension of the corresponding complementary structure, e.g. a clear line with resist being removed from it bordering a larger resist pad.

Larger pads of resist include a stronger heat capacity, i.e. provide a stronger flow of resist as compared with thin lines, which in the case of too high temperatures cool faster in an adjacent cooling and do not provide that much flowing material that enters the clear lines.

Therefore, it may occur that the temperature setup of, e.g. the post-bake step is already adapted to small feature sizes, but thereby disregarding the bad impact of resist flow from larger resist pads into clear lines or pads at the same temperature. Therefore, measuring the sidewall angle of the transition area between the resist and the clear space after the development of test patterns, which are suited to the pattern representing the integrated circuit to be structured, provides a particularly advantageous method.

The problems that can be directly addressed by the present invention that originate from resist flow due to temperatures that are chosen to be too high include:

a change of the etch bias;

an etch attack of underlying layers;

unexpected implantation by missing depth uniformity;

overlay problems due to asymmetric sidewall angles, e.g. if there is a large resist pad on one side of a clear line and a thin resist line on the other side, thus leading to a pattern shift; and critical dimension measurement problems.

These problems are cured by detecting the sidewall angles and comparing them with previously set threshold values. These threshold values are set to guarantee a neglectable resist flow for any structure sizes on the pattern that will be projected onto the resist.

In an aspect of the present invention, at least two, preferably a series of measurements are performed for each wafer to obtain a sidewall angle as a function of temperature. Starting with a temperature that is known to lie well within the allowed range for the temperature setup and then increasing the applied temperature stepwise for each wafer (e.g. by a constant difference), the curve of such a function will generally increase monotonically, and therefore exceed the given threshold value at a critical temperature. The temperature such determined is then used as the pattern and process dependent maximum temperature for the temperature setup of the resist process.

Preferably, prior to starting a set of production wafers, a test-reticle providing a variety of combinations of pad and antenna structures is used to measure a sequence of sidewall angles as a function of temperature. The test patterns on the reticle are a combination of a resist pad supplied with one or more antennas, the critical dimensions of which represent the variety of critical dimensions provided on the production pattern which are subsequently processed. Thus, advantageously, the impact of the resist pad extent on resist flow for different temperatures can easily be measured, detected and used for adjusting the temperature of the actual resist process. Examples of test patterns are given in the embodiments below.

It is also possible to provide these test patterns with the integrated circuit pattern, but positioned in the scribeline area as in the case of conventional metrology marks. In both cases—i.e. the series of test wafers inspected in advance of production wafers, or the test patterns defined in the scribe line area of production wafers—the test sites are inspected and measured after the corresponding bake step by using, a scanning electron microscope (SEM), an interferometer, or a scatterometer, for example. Particularly in the latter case, the sidewall angles have a deep impact on scattered or defracted light that is detected by the scatterometer.

Other features which are considered as characteristic for the invention are set forth in the appended claims.

Although the invention is illustrated and described herein as embodied in a Method for adjusting a temperature in a resist process, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
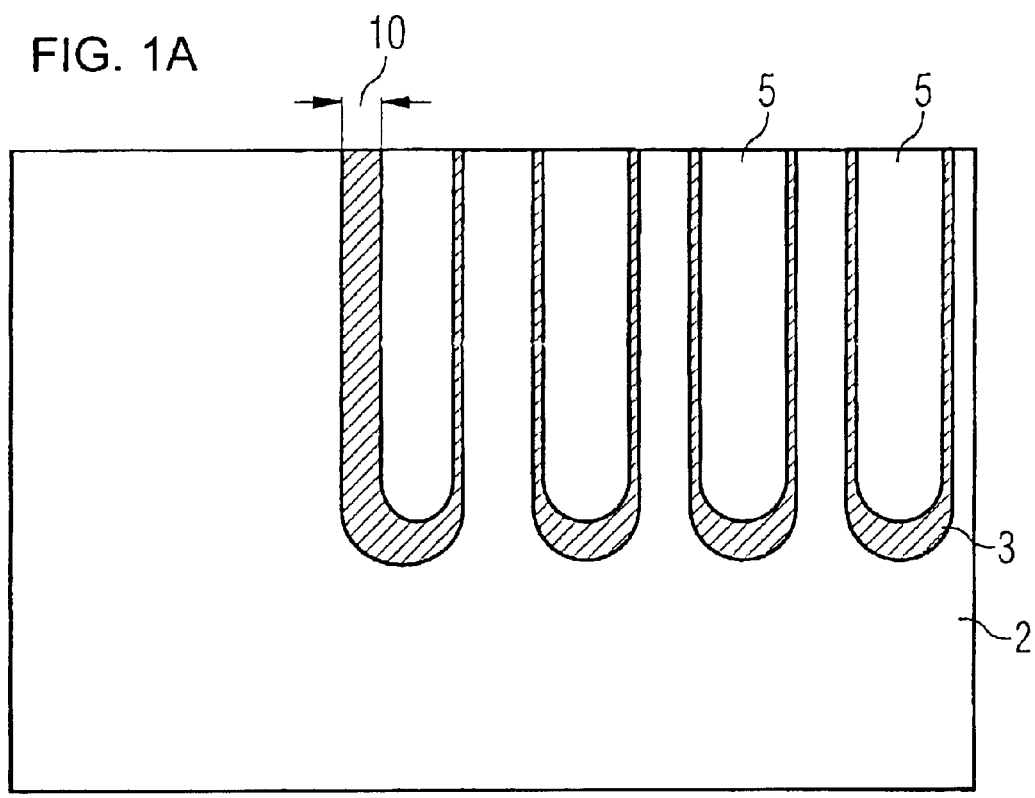
FIG. 1A shows a top view of a resist pad and lines interrupted by clear lines after a post-bake step.

Referring now to the figures of the drawing in detail and first, particularly, to FIG. 1A thereof, the problem of resist flow occurring at too high temperatures in a resist process is shown. The pattern shown in FIG. 1A reveals a sequence of four clear lines 5 which have been structured by exposing the resist, baking it for impeding the generation of stationary waves, developing the lines by solving and removing the material inside the lines 5. During the post-exposure bake and immediately afterwards, the heat buried in the resist pad 2 leads to a flow of resist 8 towards the lines 5, thereby leading to an inward movement of the sidewalls, which are orientated towards the resist pad areas having a large extent. The narrow areas surrounded by the clear lines 5 provide a faster cooling and therefore contribute less to the resist flow. The sidewall angle 1 developing at the resist sidewalls 3 towards to the resist pad 2 is thus smaller than the steep sidewalls 3 orientated towards smaller resist structures surrounded by clear lines.

Figure 1B:
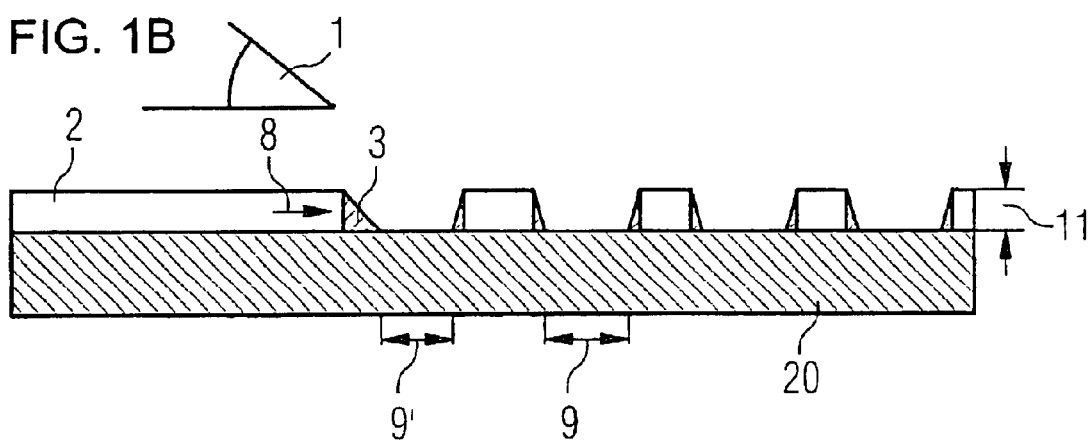
FIG. 1B shows a side view of a resist pad and lines interrupted by clear lines after a post-bake step.
Figure 2A:
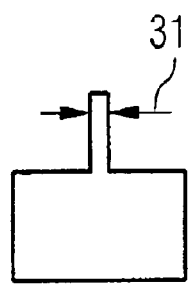
FIGS. 2A–2E show five examples of test patterns structured on a dedicated test reticle or in a scribeline area of an integrated circuit pattern.
Figure 2B:
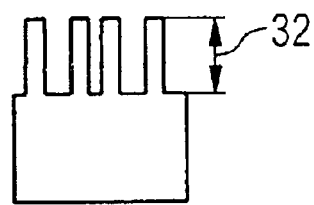
Figure 2C:
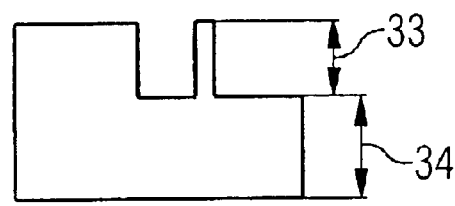
Figure 2D:
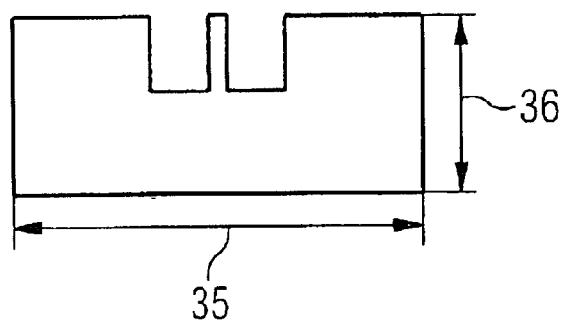
Figure 2E:
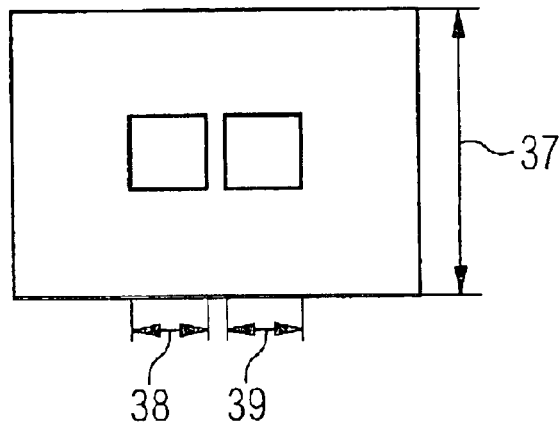

As is visible from the side view provided in FIG. 1B, the sidewall angle 1 produced by the resist flow 8 caused by too high temperatures in a resist process can be calculated from a known resist thickness 11 and the critical-dimension 10 of the sidewall as seen from the top view. Alternatively, the critical dimension 9' of an affected clear line 5 can be compared with the critical dimension 9 of a line that is not or nearly not affected by resist flow due to being structured in a dense pattern.

From these figures, it becomes clear that large structures, e.g. the large resist pad 2, can have strong effects on the process results while small features are less affected. Therefore, a default control overlay measurement in small, dense structures would prevent an operator from finding defects in structures having larger sizes on the same chip.

According to an embodiment of the present invention, a test reticle having a set of at least five test structures, shown in FIGS. 2A–2E, is used to expose a sequence of test wafers. The test patterns include antenna and pad structures in order to leave corresponding unexposed patterns behind on the wafer. In a following metrology step, e.g. an inspection with a scanning electron microscope (SEM), the amount of resist flow resulting in critical dimension variation and sidewall angle development can easily be measured by comparing the antenna diameters with the pad diameters. Different relative arrangements of the antenna lines and the pad structures provide an accurate estimation of the amount of resist flow, e.g. a measurement of the critical dimensions 31, 32, 33, 38, 39 relating to the antenna structures, and the critical dimensions 34, 35, 36, 37 relating to the pad areas.

According to the present invention, less than five test structures can also be provided. This embodiment just points out an advantageous group of test structures providing an easy-to-determine approach for the sidewall angle or critical dimension.

Figure 4:
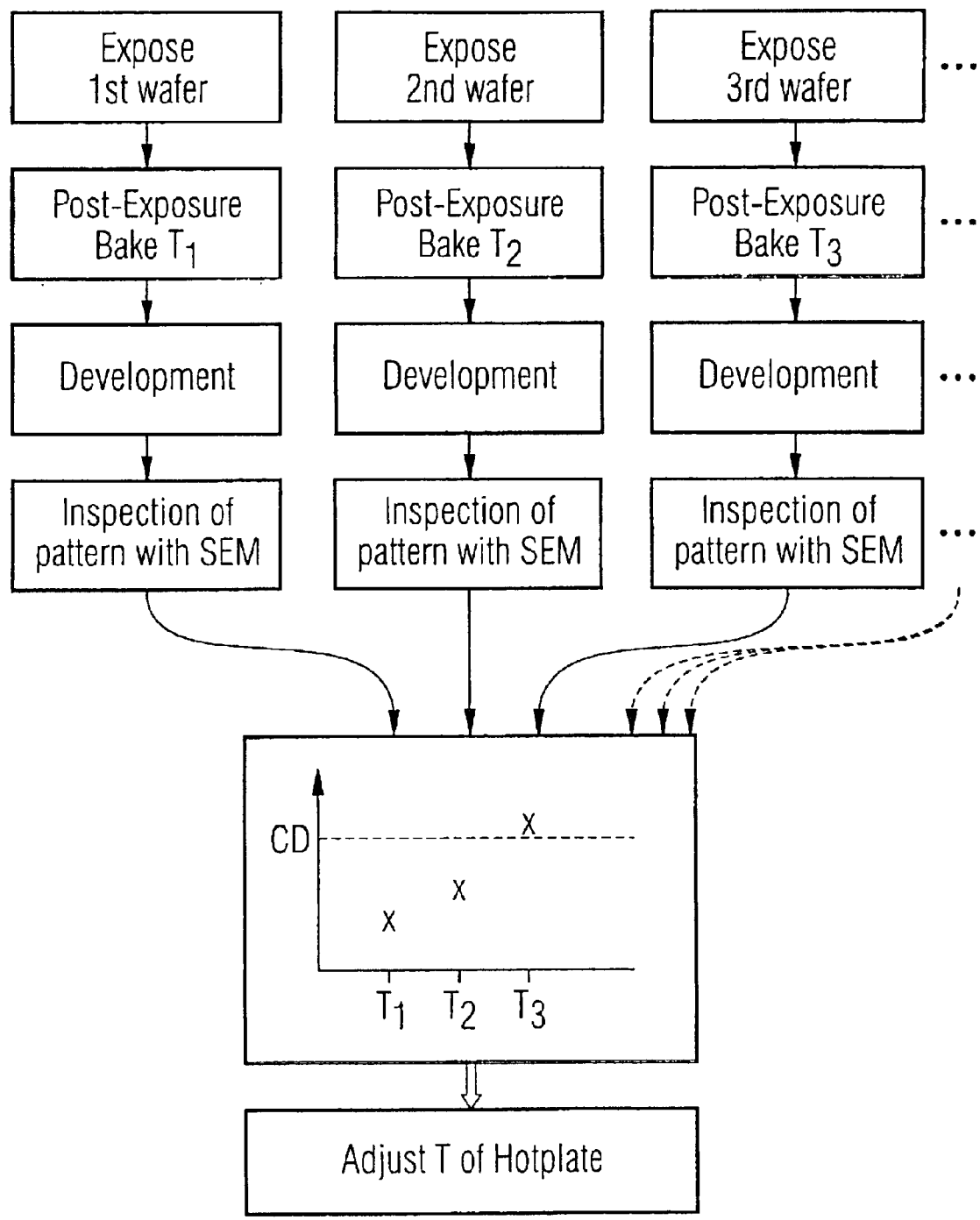
FIG. 4 shows a flowchart of an embodiment of the inventive method.

It has to be noted, that the critical dimensions corresponding to the pad and antenna diameters 31–39 are not the same as the sidewall critical dimensions 10, but both values can be directly inferred from each other as follows:

The test reticle provided with the test patterns is used to expose a sequence of wafers. After each exposure, a post-exposure bake is performed starting with a first temperature for the first wafer, an incremented second temperature for the second wafer, and a further incremented third temperature for the third wafer, etc., as shown in FIG. 4. Thereafter, the resist of each of the wafers is developed and an inspection with an SEM is performed to measure the critical dimension of the sidewall as a function of the post-exposure bake temperature. The critical dimension (CD) 10 of the sidewall can either be measured directly at, e.g. the antenna structure provided in FIG. 2A, or can-be measured indirectly by a change of the antenna or pad—the critical dimension relative to a default value as inferred from the reticle test pattern or a default measurement at sufficiently low temperatures, or from geometric considerations combining all measured CDs.

Figure 3:
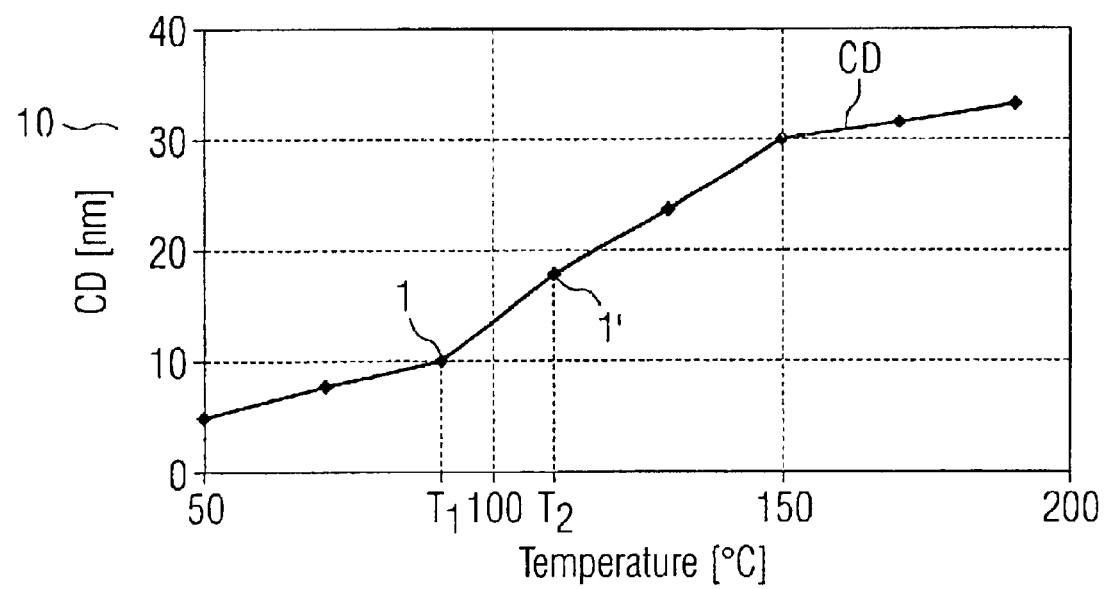
FIG. 3 shows a plot of the measured sidewall angle as a function of temperature for 8 subsequently measured wafers.

A threshold value that corresponds to the design requirements and the wafer specifications of the actual product is then compared with each of the critical dimension values measured for the temperatures, which are plotted in FIG. 3. A threshold value of 10 nm reveals for this measurement of eight subsequently inspected wafers, that a temperature of 90° C. is the maximum temperature that will be adjusted for the hot plate performing the post-exposure bake step.

Even if there is no threshold value available from the design requirements, it is expected that resist flow sets in at a process and design-dependent temperature and this temperature is clearly visible from an abrupt increase of the sidewall angle as a function of the temperature. This abrupt change is seen in FIG. 3 between the third and fourth wafer representing temperatures T1, T2, thereby also indicating a maximum temperature of 90° C. for the post-exposure bake step.

We claim:

1. A method for adjusting a temperature in a resist process, which comprises:

providing at least a first semiconductor wafer coated with a resist;

providing a reticle test pattern including at least one pad structure having a first critical dimension and at least one antenna structure having a second critical dimension, the antenna structure being connected to the pad structure and the first critical dimension being at least 1.5 times the second critical dimension;

exposing the first semiconductor wafer by projecting the pattern onto the resist to configure the pattern into the resist;

performing a first resist process on the first semiconductor wafer while applying a first temperature;

determining a first sidewall angle of the pattern in the resist on the first semiconductor wafer by:

obtaining a first measured value by measuring the second critical dimension of the antenna structure, obtaining a second measured value by measuring the first critical dimension of the pad structure, and comparing the first measured value and the second measured value;

issuing a first signal, if the first sidewall angle exceeds a pre-defined threshold value; and adjusting the temperature of the resist process in response to the first signal.

2. The method according to claim 1, which comprises:

providing at least a second semiconductor wafer coated with a resist;

exposing the second semiconductor wafer to configure the pattern in the resist on the second semiconductor wafer;

performing a second resist process on the second semiconductor wafer with a second temperature that is different from the first temperature;

measuring a second sidewall angle of the pattern in the resist on the second semiconductor wafer;

comparing the first sidewall angle and the second sidewall angle;

issuing a second signal, if the difference between the first sidewall angle and the second sidewall angle exceeds a pre-defined difference threshold value; and adjusting the temperature of the resist process in response to the second signal.

3. The method according to claim 2, wherein:

the pattern in the resist on the first semiconductor wafer is structured within a scribeline area of the first semiconductor wafer; and the pattern in the resist on the second semiconductor wafer is structured within a scribeline area of the second semiconductor wafer.

4. The method according to claim 1, wherein: the pattern in the resist on the first semiconductor wafer is structured within a scribeline area of the first semiconductor wafer.

5. The method according to claim 4, wherein:

the step of determining the first sidewall angle is performed by using at least one device selected from the group consisting of a scanning electron microscope, an interferometer, and a scatterometer.

* * * * *